United States Patent
Cai et al.

(10) Patent No.: US 9,601,387 B2
(45) Date of Patent: Mar. 21, 2017

(54) METHOD OF MAKING THRESHOLD VOLTAGE TUNING USING SELF-ALIGNED CONTACT CAP

(71) Applicant: GLOBALFOUNDRIES Inc., Grand Cayman (KY)

(72) Inventors: Xiuyu Harry Cai, Niskayuna, NY (US); Chanro Park, Clifton Park, NY (US); Hoon Kim, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 197 days.

(21) Appl. No.: 14/147,108

(22) Filed: Jan. 3, 2014

(65) Prior Publication Data

US 2015/0194350 A1    Jul. 9, 2015

(51) Int. Cl.
*H01L 21/8238* (2006.01)
*H01L 27/092* (2006.01)
(Continued)

(52) U.S. Cl.
CPC .... *H01L 21/823828* (2013.01); *H01L 21/022* (2013.01); *H01L 21/0217* (2013.01);
(Continued)

(58) Field of Classification Search
CPC ......... H01L 21/823857; H01L 21/8238; H01L 21/02252; H01L 21/02274; H01L 21/02315; H01L 21/022; H01L 21/0217
See application file for complete search history.

(56) References Cited

U.S. PATENT DOCUMENTS

| 6,887,783 B2 * | 5/2005 | Chen | H01L 21/76801 257/652 |
| 9,006,072 B2 * | 4/2015 | Tsao | H01L 29/665 438/299 |
| 2014/0099784 A1 * | 4/2014 | Kim | H01L 21/76801 438/589 |

OTHER PUBLICATIONS

Yota, J.; Janani, M.; Kar-Roy, A.; Liu, Q.Z.; Nguyen, C.; Hander, J.; Van Cleemput, P.; Chang, W.; Chiou, W.C.; Li, L.J.; Chao, L.C.; Jang, S.M.; Yu, C.H.; Liang, M.S., "Comparison between HDP CVD and PECVD silicon nitride for advanced interconnect applications," in Interconnect Technology Conference, 2000. Proceedings of the IEEE 2000 Internationa.*

(Continued)

*Primary Examiner* — Phat X Cao
*Assistant Examiner* — Diana C Vieira
(74) *Attorney, Agent, or Firm* — Ditthavong & Steiner, P.C.

(57) ABSTRACT

Methods of forming a PFET dielectric cap with varying concentrations of $H_2$ reactive gas and the resulting devices are disclosed. Embodiments include forming p-type and n-type metal gate stacks, each surrounded by SiN spacers; forming an ILD surrounding the SiN spacers; planarizing the ILD, the metal gate stacks, and the SiN spacers; determining at least one desired threshold voltage for the p-type metal gate stack; forming a first cavity in the p-type metal gate stack for each desired threshold voltage and a second cavity in the n-type metal gate stack; selecting a first nitride layer for each first cavity, the first nitride layer for each cavity having a concentration of hydrogen reactive gas based on the desired threshold voltage associated with the cavity; forming the first nitride layers in the respective first cavities; and forming a second nitride layer, with a hydrogen rich reactive gas, in the second cavity.

10 Claims, 15 Drawing Sheets

(51) Int. Cl.
  *H01L 21/02*   (2006.01)
  *H01L 21/28*   (2006.01)
  *H01L 29/66*   (2006.01)
(52) U.S. Cl.
  CPC .............. *H01L 21/28176* (2013.01); *H01L 21/823821* (2013.01); *H01L 27/092* (2013.01); *H01L 21/8238* (2013.01); *H01L 21/823857* (2013.01); *H01L 29/66545* (2013.01)

(56) References Cited

OTHER PUBLICATIONS

J. W. Lee, K. D. Mackenzie, D. Johnson, S. J. Pearton, F. Ren and J. N. Sasserath (1999). Development of Low Temperature Silicon Nitride and Silicon Dioxide Films by Inductively-Coupled Plasma Chemical Vapor Deposition. MRS Proceedings, 573, 69.*

* cited by examiner

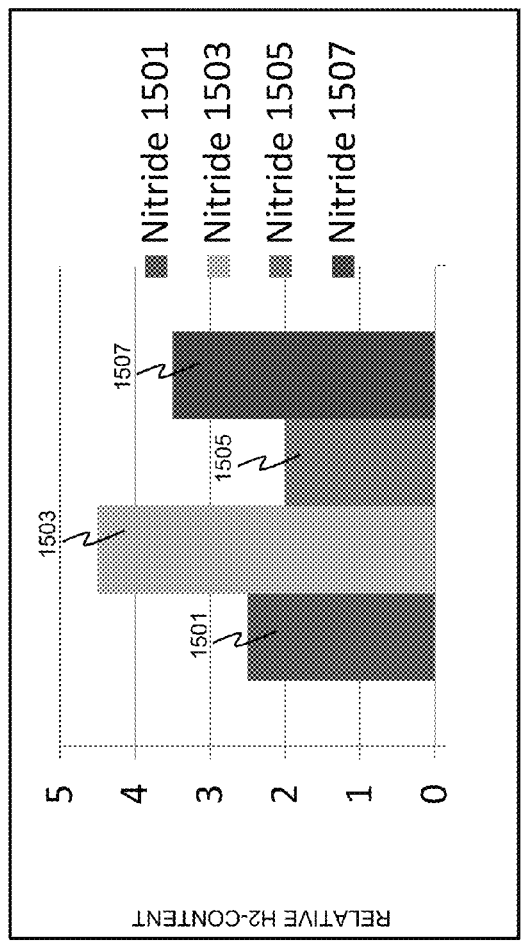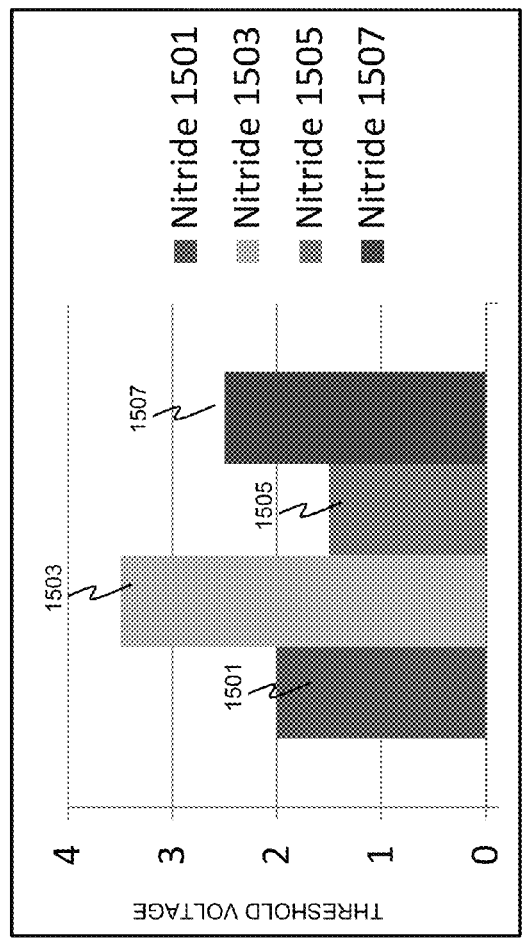
FIG. 15A
FIG. 15B

METHOD OF MAKING THRESHOLD VOLTAGE TUNING USING SELF-ALIGNED CONTACT CAP

TECHNICAL FIELD

The present disclosure relates to the manufacture of semiconductor devices with self-aligned contacts (SACs). The present disclosure is particularly applicable to 14 nanometer (nm) technology nodes and beyond, or sub-64 nm critical poly pitch (CPP) devices.

BACKGROUND

A self-aligned contact is essential for 14 nm technology nodes to eliminate massive polysilicon gate electrode (PC) to source/drain contact (CA) short for sub 64 nm CPP devices. The self-aligned contact is usually realized by implementing a silicon nitride (SiN), a silicon carbon nitride (SiCN), or a silicon boron carbon nitride (SiBCN) cap material on top of the gate electrode to act as a contact etch stop layer. However, the gate stack is particularly sensitive to cap process conditions, which often result in threshold voltage (Vt) shift up to 300 millivolts (mV) for p-channel field-effect transistors (PFETs) or Vt roll-up issues for n-channel field-effect transistors (NFETs).

A need therefore exists for a methodology enabling formation of a dielectric cap without Vt shift or Vt roll-up, and the resulting device.

SUMMARY

An aspect of the present disclosure is a process of forming a PFET dielectric cap using a hydrogen ($H_2$)-free reactive gas.

Another aspect of the present disclosure is a device including a PFET having a dielectric cap formed with a $H_2$-free reactive gas.

An aspect of the present disclosure is a process of forming an NFET dielectric cap using a $H_2$-rich reactive gas.

Another aspect of the present disclosure is a device including an NFET having a dielectric cap formed with a $H_2$-rich reactive gas.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming p-type and n-type metal gate stacks, each surrounded by SiN spacers; forming an interlayer dielectric (ILD) surrounding the SiN spacers; planarizing the ILD, the p-type and n-type metal gate stacks, and the SiN spacers; determining at least one desired threshold voltage for the p-type metal gate stack; forming a first cavity in the p-type metal gate stack for each desired threshold voltage and forming a second cavity in the n-type metal gate stack; selecting a first nitride layer for each first cavity, the first nitride layer for each cavity having a concentration of hydrogen reactive gas based on the desired threshold voltage associated with the cavity; forming the first nitride layers in the respective first cavities; and forming a second nitride layer, with a hydrogen rich reactive gas, in the second cavity.

Aspects of the present disclosure include forming a single cavity and selecting the first nitride layer with a hydrogen free reactive gas. Other aspects include forming the first nitride layer in the first cavity to a thickness of 3 nm to 10 nm; and forming the second nitride layer over the first nitride layer in the first cavity concurrently with forming the second nitride layer in the second cavity. Another aspect includes forming the first nitride layer in the second cavity to a thickness of 3 nm to 10 nm concurrently with forming first nitride layer in the first cavity; and removing the first nitride layer from the second cavity, prior to forming the second nitride layer. Additional aspects include planarizing the ILD, the p-type and n-type metal gate stacks, and the SiN spacers by chemical mechanical polishing (CMP).

Additional aspects include forming the first nitride layer using nitrogen ($N_2$) and forming the second nitride layer using ammonia/hydrogen gas ($NH_3/H_2$). Other aspects include forming the first cavity in the p-type metal gate stack and forming the second cavity in the n-type metal gate stack by a halide-based etch process. Further aspects include etching each of the first and second cavities to a depth of 20 nm to 50 nm. Another aspect includes removing a portion of the SiN spacers to a depth of 20 nm to 50 nm prior to forming each of the first and second cavities in the p-type and n-type metal gate stacks, respectively.

Another aspect of the present disclosure is a device including: p-type and n-type metal gate stacks each surrounded by SiN spacers; an ILD surrounding the SiN spacers; first and second cavities in the ILD over the p-type and n-type metal gate stacks and corresponding SiN spacers, respectively; and first and second nitride caps formed in the first and second cavities, respectively, wherein the first nitride cap comprises a first nitride formed with a $H_2$-free reactive gas, and the second nitride cap comprises a second nitride formed with a $H_2$-rich reactive gas. Aspects of the device include the first nitride cap being formed with $NH_3$ and the second nitride cap is formed with $NH_3/H_2$. Other aspects include the first nitride cap being formed of the first nitride, the first nitride being formed to a thickness of 3 nm to 10 nm, and the second nitride being formed over the first nitride. Further aspects include source/drain regions formed on opposite sides of each of the p-type and n-type metal gate stacks; a second ILD formed over the first ILD and the first and second nitride caps; and a source/drain contact formed through the first and second ILDs down to a source/drain region.

Another aspect of the present disclosure is a method including: forming p-type and n-type metal gate stacks, each surrounded by SiN spacers; forming an ILD surrounding the SiN spacers; planarizing the ILD, the p-type and n-type metal gate stacks, and the SiN spacers; forming a first cavity in the p-type metal gate stack and forming a second cavity in the n-type metal gate stack; forming a nitride liner, with a H-free reactive gas, in each of the first and second cavities; forming a bulk nitride layer on the nitride liner; and planarizing the bulk nitride layer down to the ILD. Other aspects include forming the nitride liner to a thickness of 3 nm to 10 nm. Further aspects include forming the nitride liner by a high density plasma (HDP) process using $N_2$ and forming the bulk nitride layer by HDP using $NH_3$. Another aspect includes removing a portion of the SiN spacers surrounding each gate stack prior to removing the portion of the first and second metal gate stacks.

Another aspect of the present disclosure is a device including: p-type and n-type metal gate stacks each surrounded by SiN spacers; a first ILD surrounding the SiN spacers; first and second cavities in the ILD over the p-type and n-type metal gate stacks and corresponding SiN spacers, respectively; and first and second nitride caps in the first and second cavities, respectively, each nitride cap comprising a nitride liner formed with a hydrogen free reactive gas, and a bulk nitride over the nitride liner; and a second ILD formed over the first ILD and the first and second nitride caps. Aspects of the device include the nitride liner being formed to a thickness of 3 nm to 10 nm. Other aspects include the nitride liner and the bulk nitride being formed with $NH_3$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 15A and 15B schematically illustrate the relationship between the $H_2$ reactive gas concentration and the resultant threshold voltage (VTlin).

DETAILED DESCRIPTION

Figure 1:
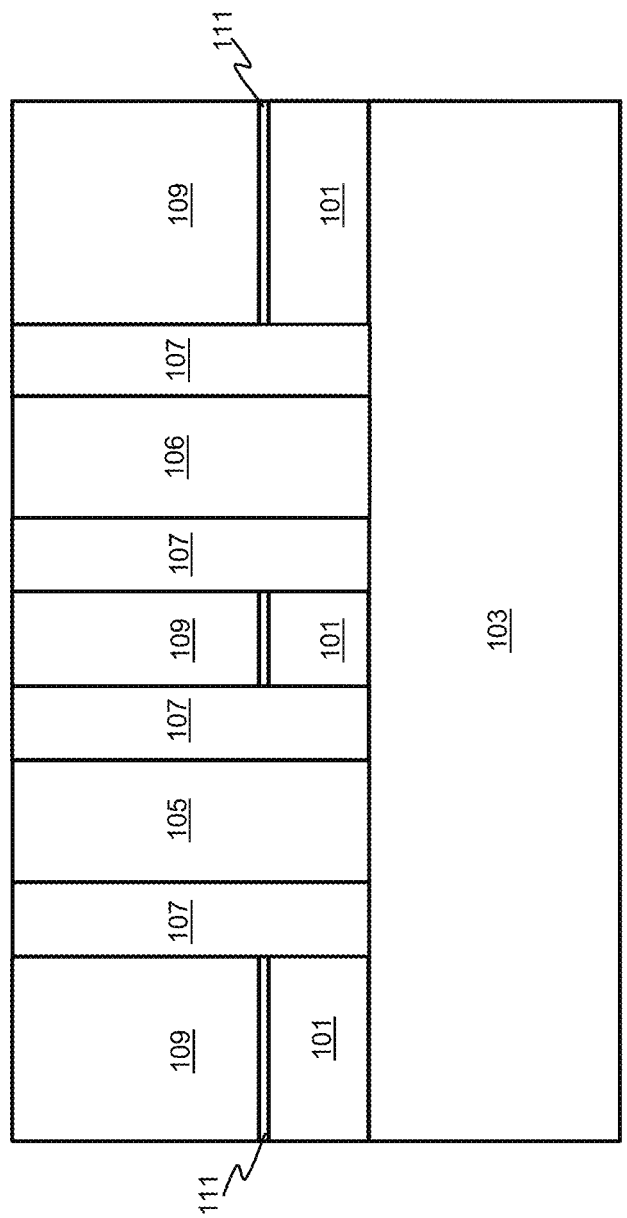
FIGS. 1 through 7 schematically illustrate steps of a method of forming PFET and NFET dielectric cap liners with $H_2$-free reactive gas, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of Vt shift or Vt roll-up issues attendant upon forming a gate stack dielectric cap by a hydrogen plasma process. By forming PFET and NFET gate stack dielectric caps with $H_2$-free and $H_2$-rich gases, respectively, Vt shift or Vt roll-up issues are prevented.

Methodology in accordance with embodiments of the present disclosure includes forming p-type and n-type metal gate stacks, each surrounded by SiN spacers. An ILD is formed surrounding the SiN spacers. The ILD, the p-type and n-type metal gate stacks, and the SiN spacers are planarized. At least one desired threshold voltage is determined for the p-type metal gate stack. A first cavity is formed in the p-type metal gate stack for each desired threshold voltage and a second cavity is formed in the n-type metal gate stack. A first nitride layer is selected for each first cavity, the first nitride layer for each cavity having a concentration of hydrogen reactive gas based on the desired threshold voltage associated with the cavity. The first nitride layers are formed in the respective first cavities. A second nitride layer, with a hydrogen rich reactive gas, is formed in the second cavity.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 7 schematically illustrate sequential steps of a method of forming PFET and NFET dielectric cap liners with $H_2$-free reactive gas, in accordance with an exemplary embodiment. Adverting to FIG. 1, source/drain regions 101 are formed on a semiconductor substrate 103, e.g., planar or FIN, on opposite sides of metal gate stacks 105 and 106, each surrounded by SiN spacers 107. Metal gate stacks 105 and 106 may, for example, be a PFET and an NFET, respectively. An ILD 109 is also formed on a SiN liner 111 formed on top of the source/drain regions 101. The ILD 109, the metal gate stacks 105 and 106, and the SiN spacers 107 are then planarized by CMP.

Figure 2:
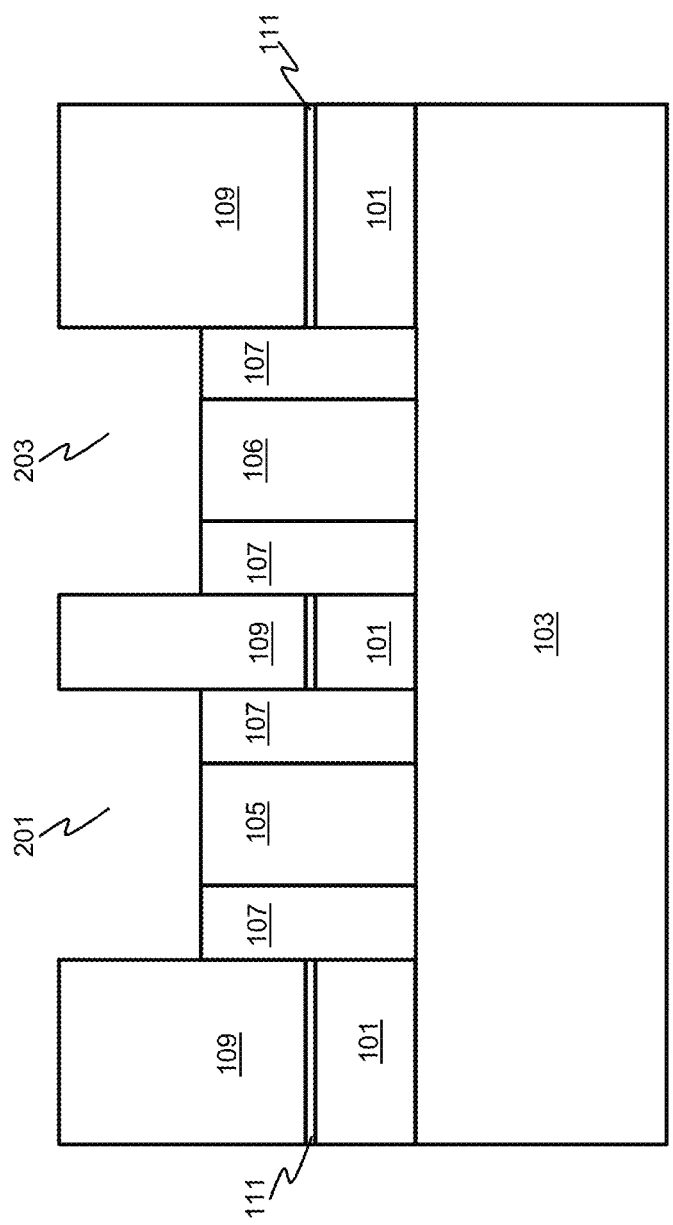
Figure 3:
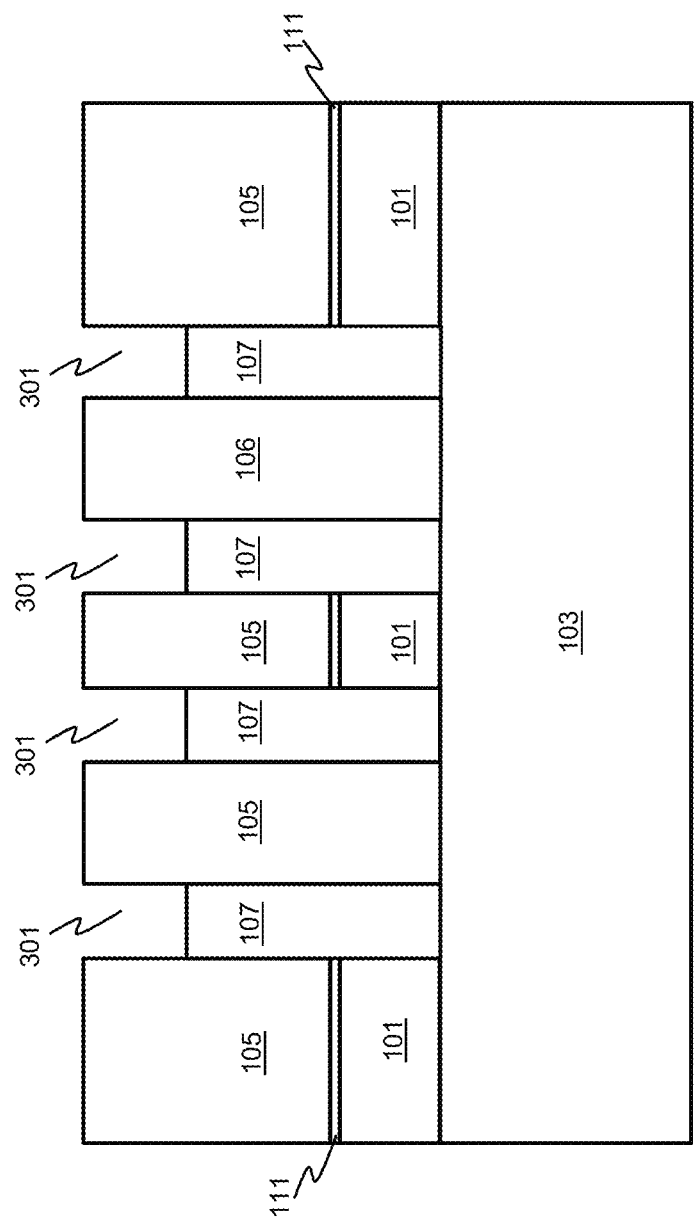

A portion of each of the metal gate stacks 105 and 106 and a portion of the SiN spacers 107 are removed by a halide-based etch process to a depth of 20 nm to 50 nm, e.g., 40 nm, forming cavities 201 and 203, respectively, as depicted in FIG. 2. Alternatively, a portion 301 of the SiN spacers 107 can be removed to a depth of 20 nm to 50 nm, e.g., 40 nm, prior to removing the portion of each of the metal gate stacks 105 and 106, as illustrated in FIG. 3.

Figure 4:
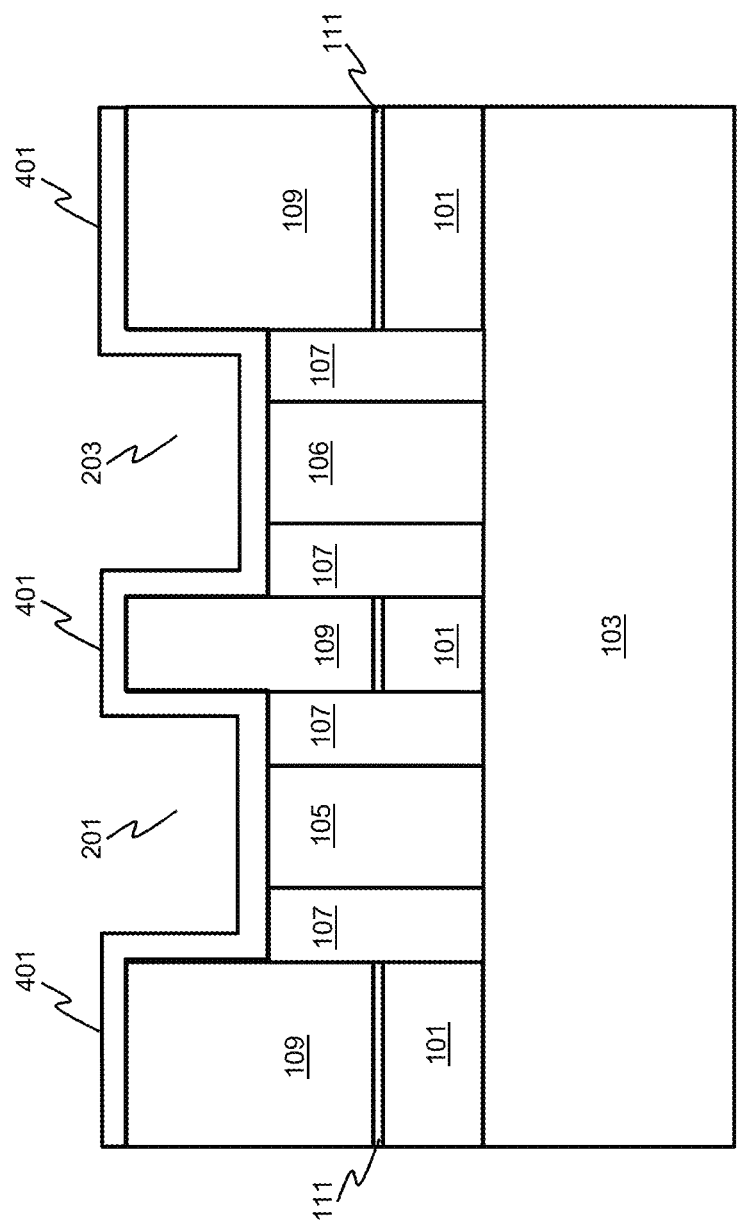
Figure 5:
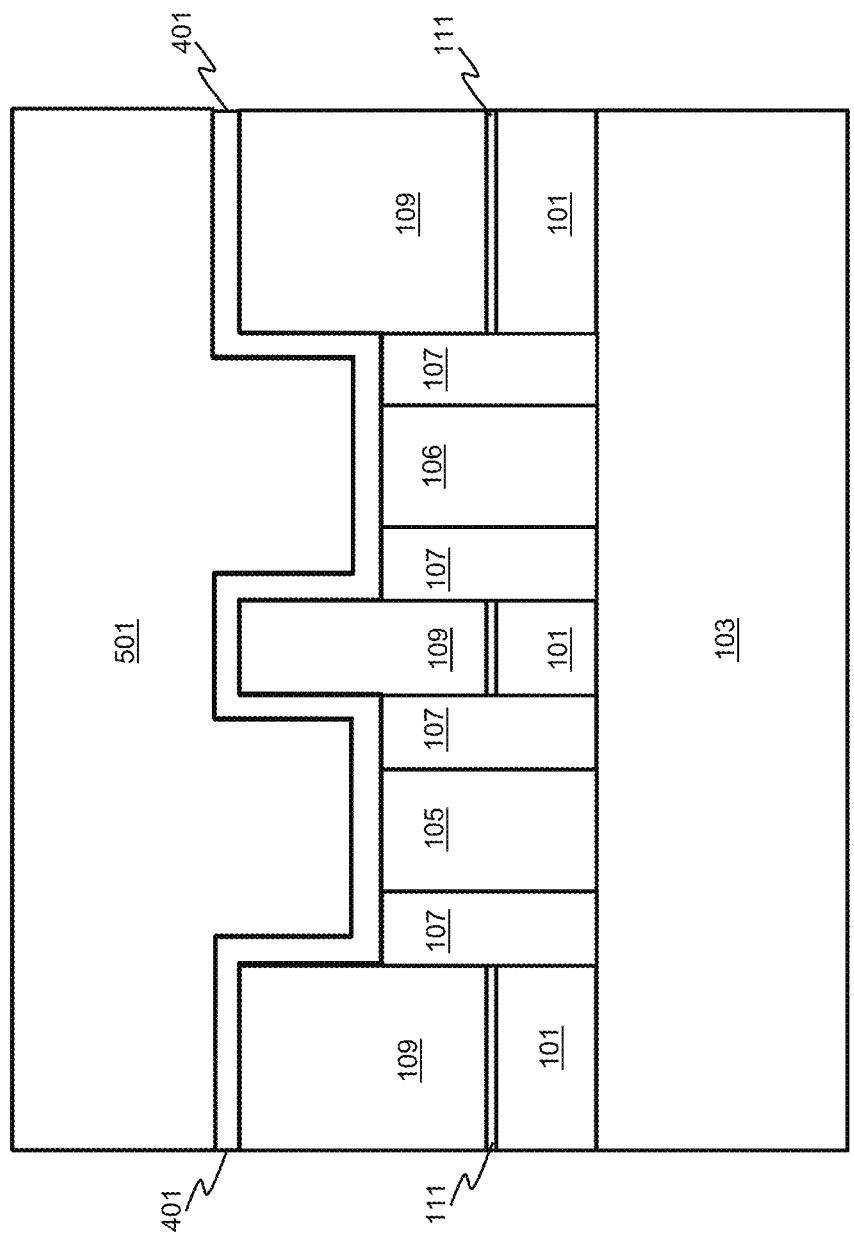
Figure 6:
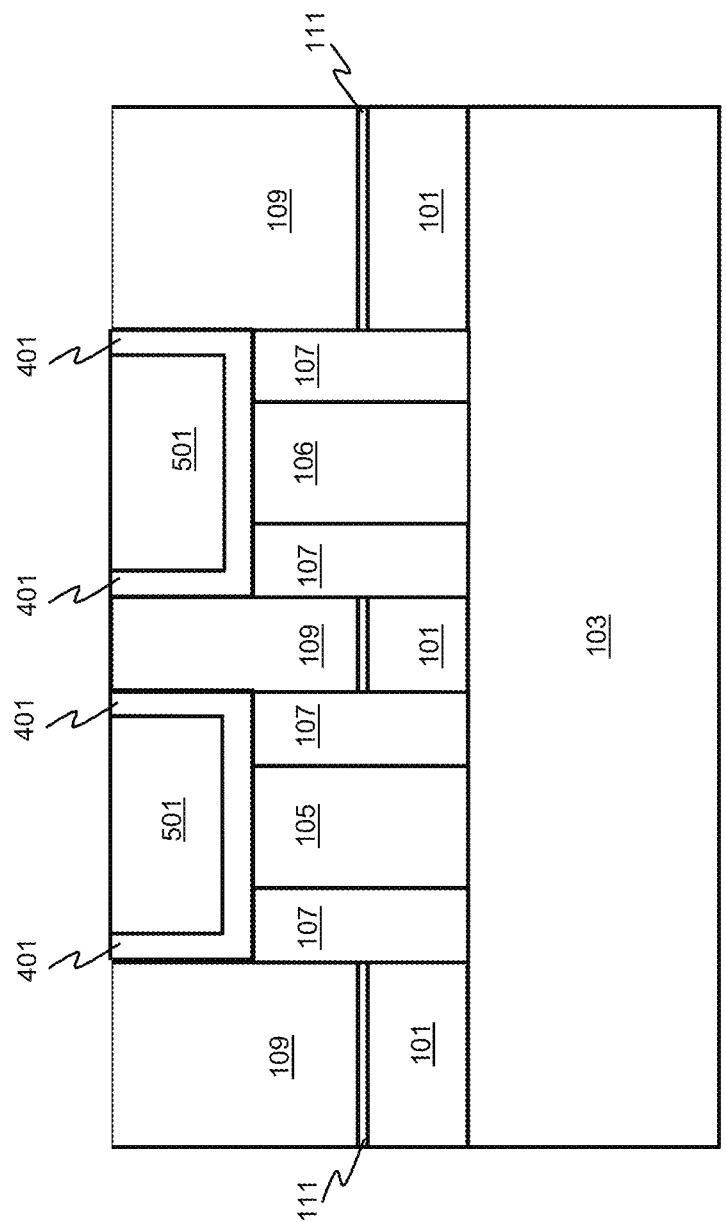
Figure 7:
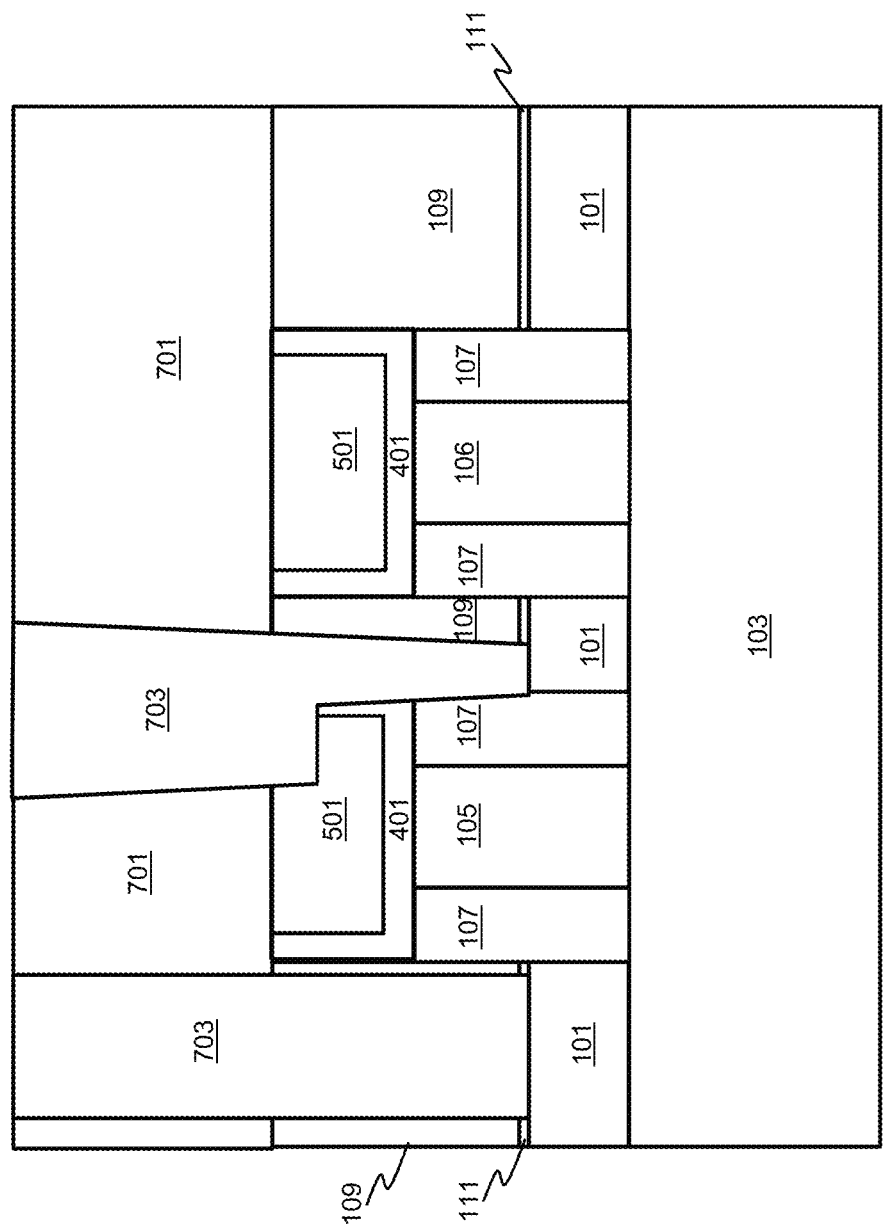
Figure 8:
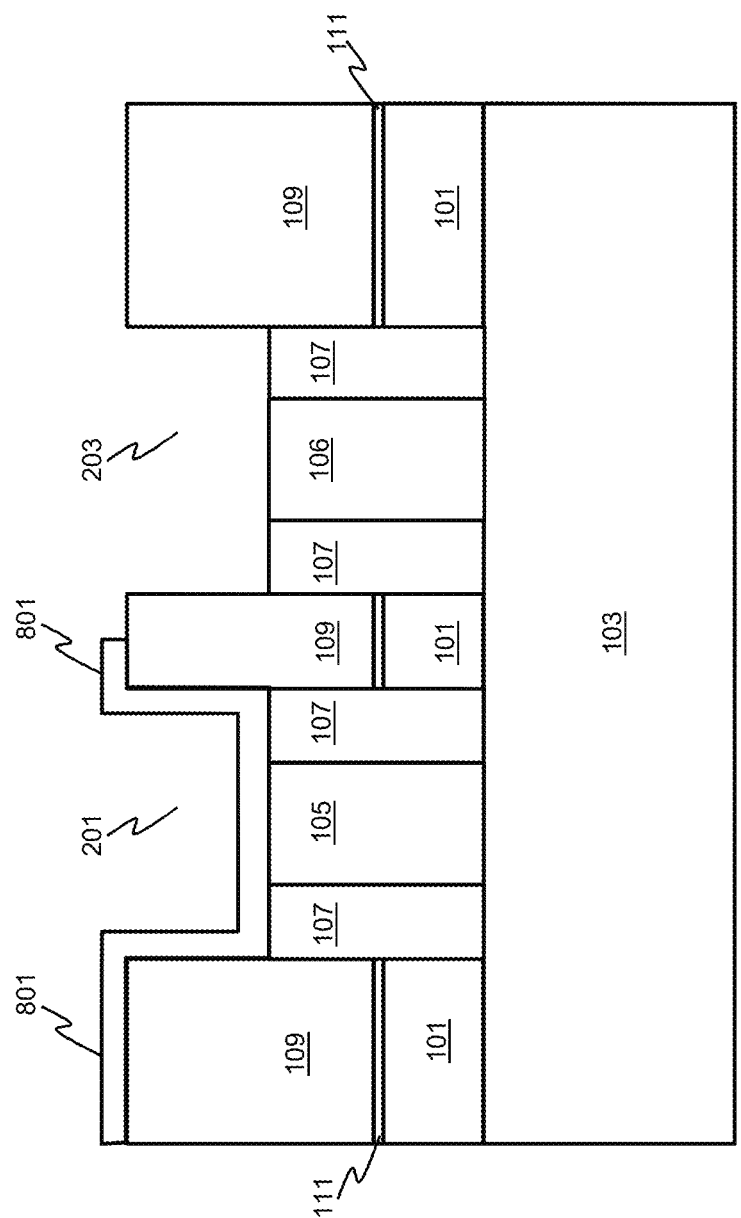
FIGS. 8 through 11 schematically illustrate sequential steps of a method of forming a PFET dielectric cap liner with $H_2$-free reactive gas and an NFET dielectric cap with $H_2$-rich reactive gas, in accordance with an exemplary embodiment.

Adverting to FIG. 4, a nitride liner 401 is formed to a thickness of 3 nm to 5 nm in each of the cavities 201 and 203 by a HDP process using a $H_2$-free reactive gas, e.g., $N_2$ or $NH_3$. Next, a bulk nitride layer 501 is formed on the nitride liner 401 by HDP using $NH_3$, as depicted in FIG. 5. Thereafter, the bulk nitride layer 501 and the nitride liner 401 are planarized by CMP down to the ILD 109, as illustrated in FIG. 6. Adverting to FIG. 7, a second ILD 701 is formed over the ILD 109, the nitride liner 401, and the bulk nitride layer 501. Then source/drain contacts 703 are formed through the ILDs 109 and 701 down to the source/drain regions 101. The nitride liner 401 blocks hydrogen from diffusing into the PFET gate electrode, preventing the PFET Vt shift.

FIGS. 8 through 11 schematically illustrate sequential steps of a method of forming a PFET dielectric cap liner with $H_2$-free reactive gas and an NFET dielectric cap with $H_2$-rich reactive gas, in accordance with another exemplary embodiment. Adverting to FIG. 8, after removing a portion of each of the metal gate stacks 105 and 106 and a portion of the SiN spacers 107, as depicted in FIG. 2, a nitride layer 801 is formed in the cavity 201 to a thickness of 3 nm to 5 nm using a H$_2$-free reactive gas, e.g., N$_2$. Alternatively, the nitride layer 801 can also be formed in the cavity 203 to a thickness of 3 nm to 5 nm using an H$_2$-free reactive gas, e.g., N$_2$, concurrently with forming the nitride layer 801 in the cavity 201 (not shown for illustrative convenience) and then removed from the cavity 203.

Figure 9:
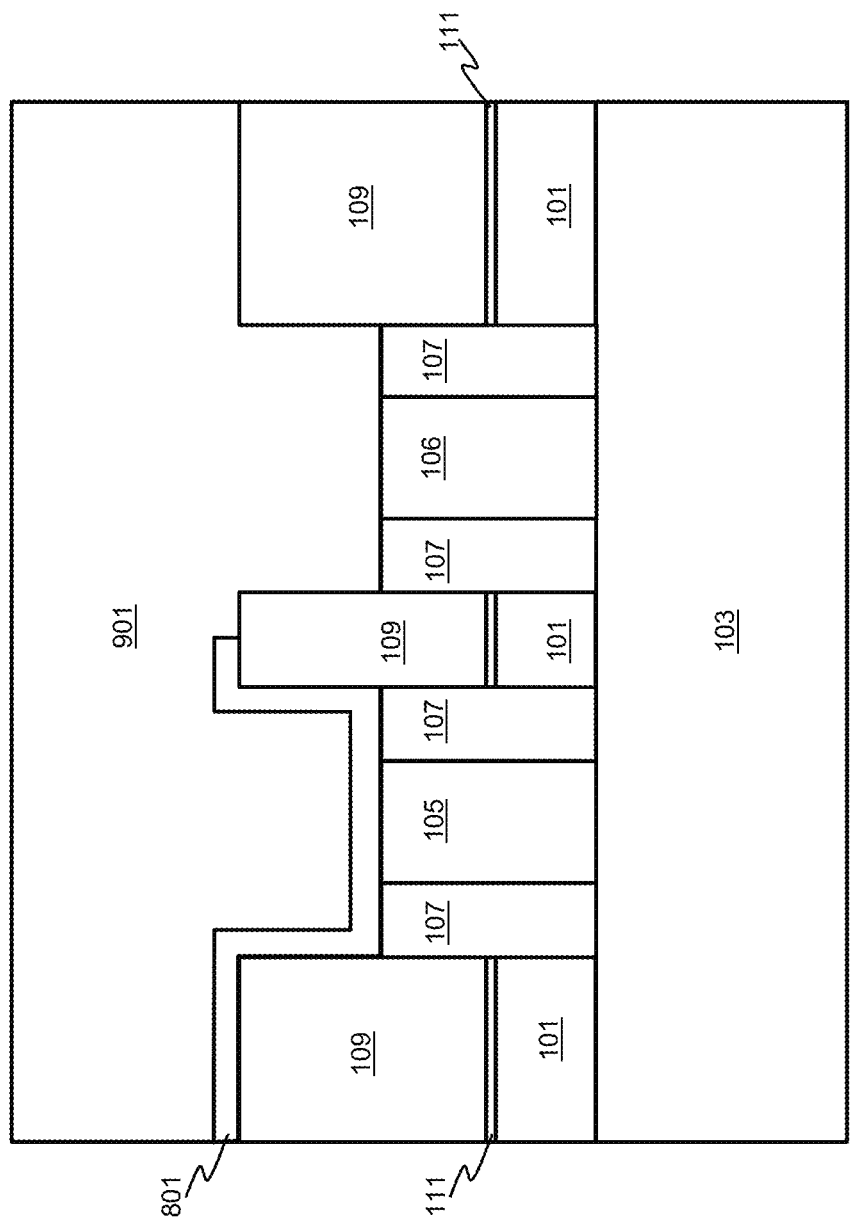
Figure 10:
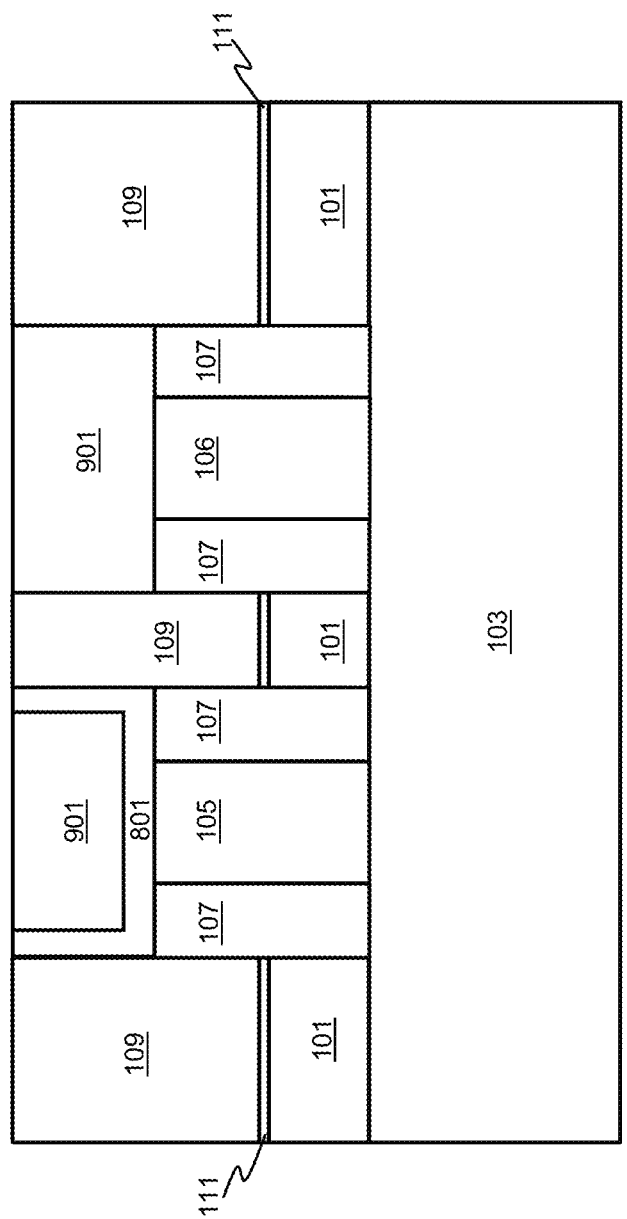
Figure 11:
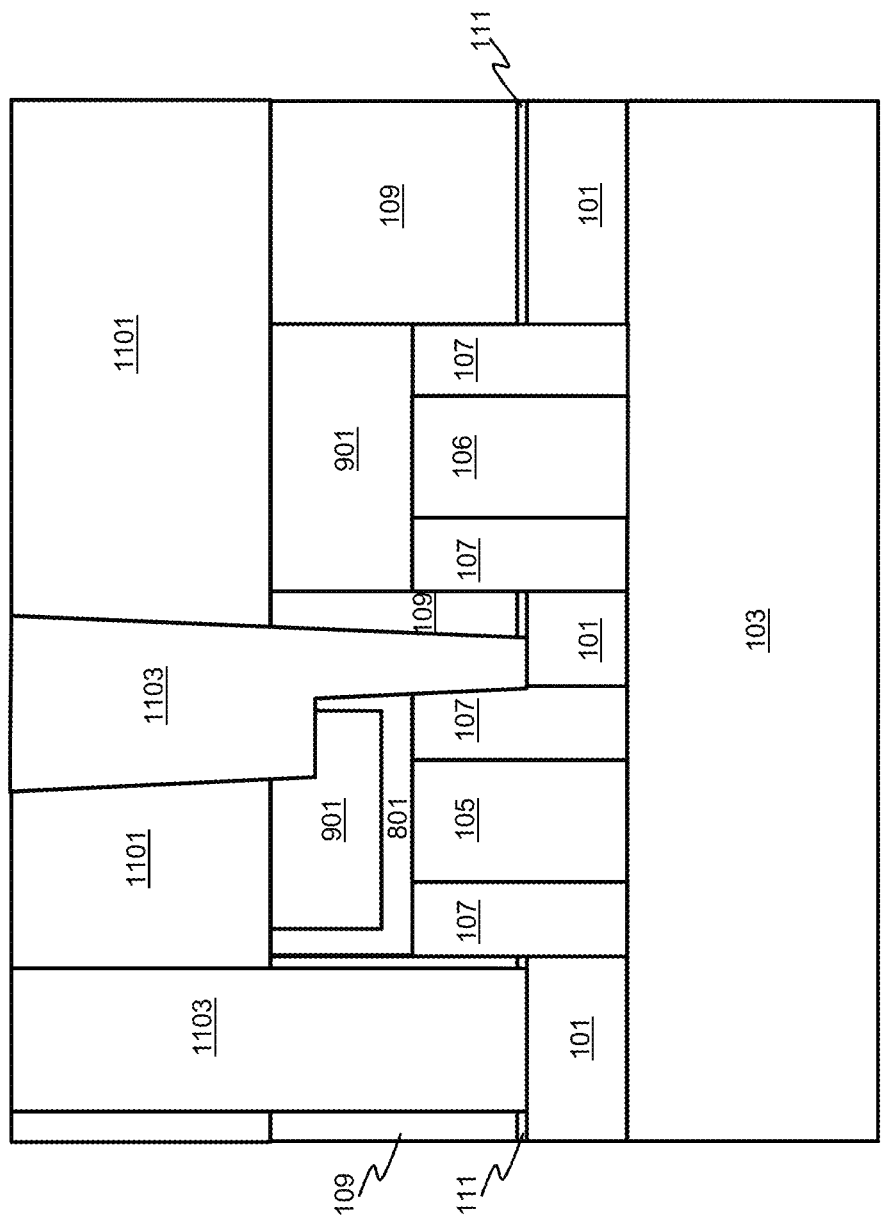

Thereafter, a nitride layer 901 is formed over the nitride layer 801 in the cavity 201 and in the cavity 203 using an H$_2$-rich reactive gas, e.g., NH$_3$/H$_2$, as depicted in FIG. 9. Adverting to FIG. 10, the nitride layer 901 and the nitride layer 801 are planarized by CMP down to the ILD 109. Next, a second ILD 1101 is formed over the ILD 109, the nitride layer 801, and the nitride layer 901 and then source/drain contacts 1103 are formed through the ILDs 109 and 1101 down to the source/drain regions 101, as depicted in FIG. 11. The nitride liner in the PFET dielectric cap prevents PFET Vt shift. At the same time, eliminating the nitride liner in the NFET dielectric cap (though requiring an additional patterning step), allows hydrogen to penetrate into the NFET gate stack and act as an oxygen scavenging source, eliminating Vt roll-up.

Figure 12:
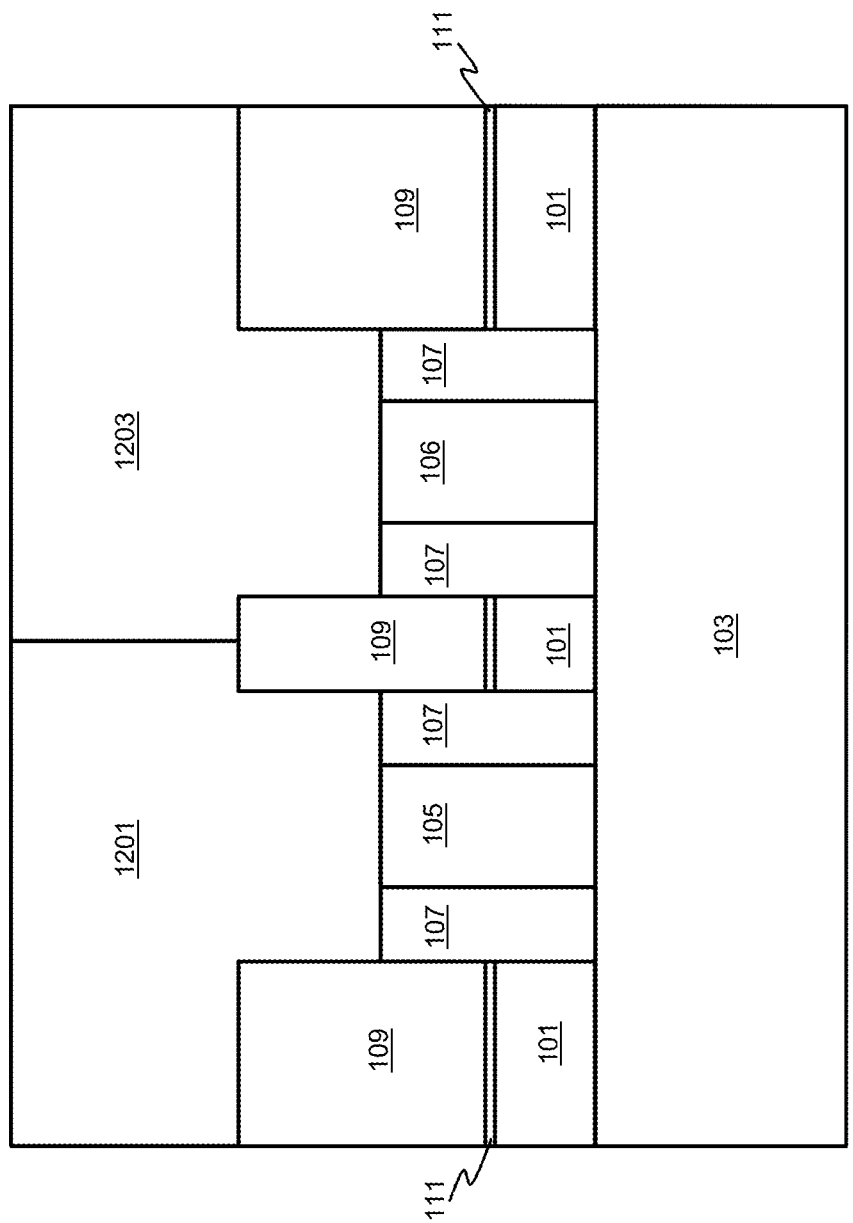
FIGS. 12 through 14 schematically illustrate sequential steps of a method of forming a PFET dielectric cap with $H_2$-free reactive gas and an NFET dielectric cap with $H_2$-rich reactive gas, in accordance with an exemplary embodiment.
Figure 13:
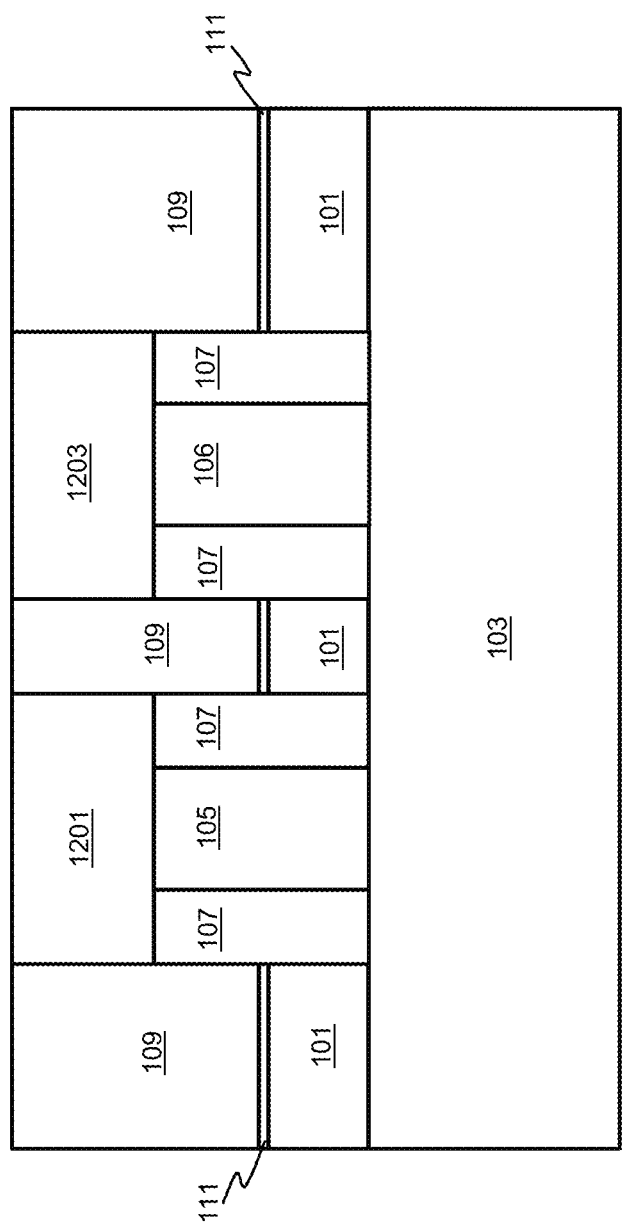
Figure 14:
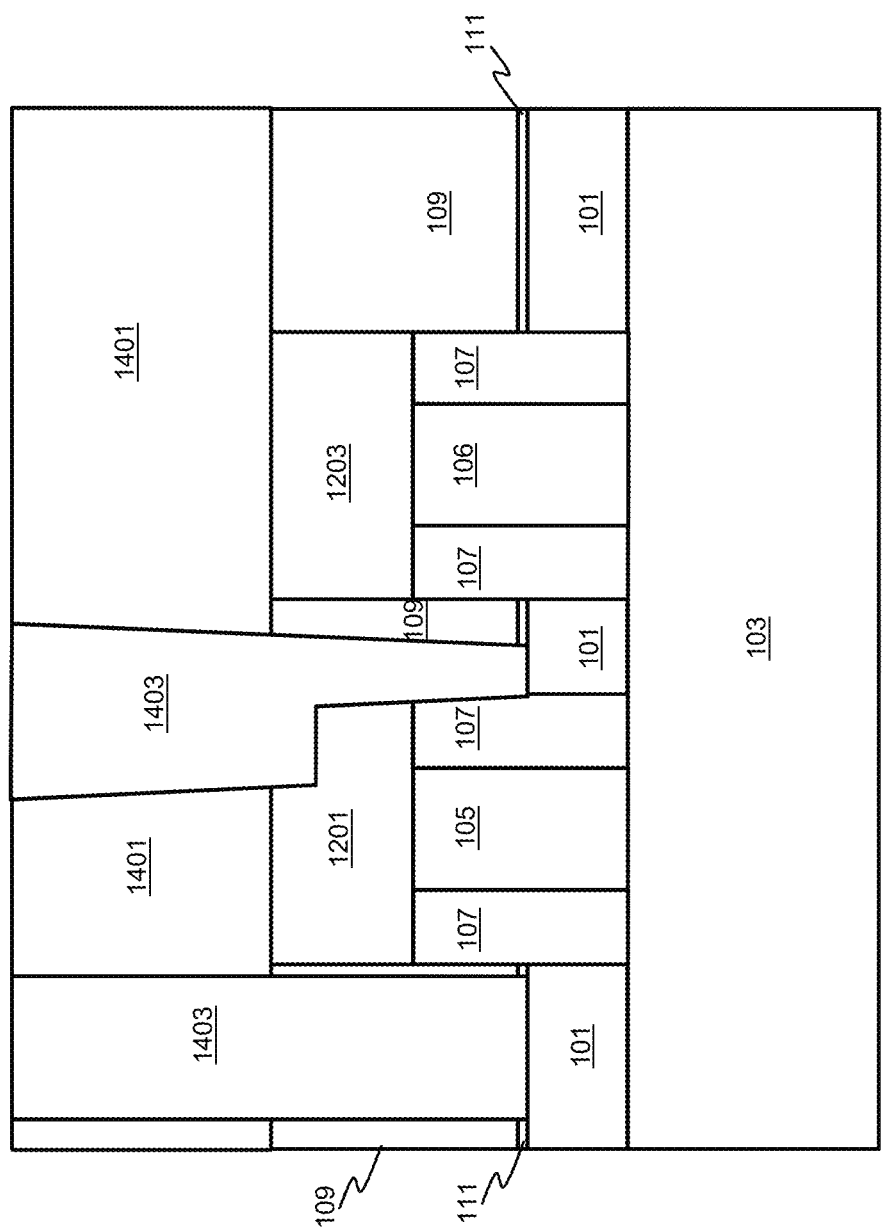

FIGS. 12 through 14 schematically illustrate sequential steps of a method of forming a PFET dielectric cap with H$_2$-free reactive gas and an NFET dielectric cap with H$_2$-rich reactive gas, in accordance with another exemplary embodiment. Adverting to FIG. 12, after removing a portion of each of the metal gate stacks 105 and 106 and a portion of the SiN spacers 107 as depicted in FIG. 12, a nitride layer 1201 is formed with an H$_2$-free reactive gas, e.g., NH$_3$, in the cavity 201 and a nitride layer 1203 is formed with an H$_2$-rich reactive gas, e.g., NH$_3$/H$_2$, in the cavity 203. The nitride layer 1201 and the nitride layer 1203 are then planarized by CMP down to the ILD 109, as depicted in FIG. 13. Adverting to FIG. 14, a second ILD 1401 is formed over the ILD 109, the nitride layer 1201, and the nitride layer 1203. Then source/drain contacts 1403 are formed through the ILDs 109 and 1401 down to the source/drain regions 101. The nitride in cavity 201 blocks hydrogen from penetrating into the PFET, whereas the nitride in cavity 203 allows hydrogen to penetrate into the NFET, which simultaneously eliminates Vt shift in the PFET and VT roll-up in the NFET. However, an extra masking step may be required for the separate deposition of the two types of nitride.

Although FIGS. 12 through 14 illustrate forming an H$_2$-free reactive gas for the PFET dielectric cap, nitride layer 1201 may alternatively be formed with a concentration of H$_2$ reactive gas based on a desired threshold voltage of the PFET. For example, FIGS. 15A and 15B schematically illustrate the relationship between the H$_2$ reactive gas concentration (FIG. 15A) and the resultant VTlin (FIG. 15B). For example, nitrides 1503 and 1507 have relatively high H$_2$ contents and relatively high resultant VTlins, whereas nitrides 1501 and 1505 have relatively low H$_2$ contents and relatively low resultant VTlins. Therefore, the greater the H$_2$ concentration that is used to form the particular nitride, the greater the resultant Vtlin. For multiple threshold voltages, multiple cavities (not shown for illustrative convenience) may be formed in metal gate stack 105, and a different nitride (i.e., with a different H$_2$ reactive gas concentration) may be formed in each cavity. In other words, the nitride for the PFET dielectric cap may be selected to tune the threshold voltage of the PFET. In addition, a H$_2$-free nitrogen layer, e.g., nitride layer 801, may be formed in one or more of the cavities of the metal gate stack 105 and then removed from a specific cavity that is desired to be tuned with a particular nitride having a particular hydrogen concentration.

The embodiments of the present disclosure can achieve several technical effects including forming a PFET dielectric cap with an H$_2$-free reactive gas, thereby preventing H$_2$ radicals from degrading the PFET Vt, which can cause Vt shift. At the same time, the introduction of an H$_2$-rich reactive gas in forming an NFET dielectric cap can prevent NFET Vt roll-up issues, since the H$_2$ can penetrate into gate stack as an oxygen scavenging source while the nitride layer/liner acts as an H$_2$ blocker on the PFET side. Alternatively, the PFET can be formed with different nitrides having different concentrations of H$_2$-rich reactive gas so as to enable tuning of the threshold voltage of the PFET. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices with SACs, particularly for 14 nm technology nodes and beyond, or sub-64 nm CPP devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a p-type metal gate stack and a n-type metal gate stack, each surrounded by silicon nitride (SiN) spacers;
    forming an interlayer dielectric (ILD) surrounding the SiN spacers;
    planarizing the ILD, the p-type metal gate stack and n-type metal gate stack, and the SiN spacers;
    determining at least one desired threshold voltage for the p-type metal gate stack;
    forming a first cavity in the p-type metal gate stack for each desired threshold voltage and forming a second cavity in the n-type metal gate stack;
    selecting a first nitride layer for each first cavity, the first nitride layer for each cavity having a concentration of hydrogen reactive gas based on the desired threshold voltage associated with the cavity;
    forming the first nitride layer in respective first cavities;
    forming a second nitride layer, with a hydrogen rich reactive gas, in the second cavity;
    forming the first nitride layer in the second cavity to a thickness of 3 nanometers (nm) to 5 nm concurrently with forming each first nitride layer in each respective first cavity; and
    removing the first nitride layer from the second cavity, prior to forming the second nitride layers.

2. The method according to claim 1, comprising:
    forming a single cavity and selecting the first nitride layer with a hydrogen free reactive gas.

3. The method according to claim 2, comprising planarizing the ILD, the p-type and n-type metal gate stacks, and the SiN spacers by chemical mechanical polishing (CMP).

4. The method according to claim 2, comprising forming the first nitride layer using nitrogen ($N_2$) and forming the second nitride layer using ammonia/hydrogen gas ($NH_3/H_2$).

5. The method according to claim 1, comprising forming the first cavity in the p-type metal gate stack and forming the second cavity in the n-type metal gate stack by a halide-based etch process.

6. The method according to claim 5, comprising etching each of the first and second cavities to a depth of 20 nm to 50 nm.

7. The method according to claim 1, further comprising removing a portion of the SiN spacers to a depth of 20 nm to 50 nm prior to forming each of the first and second cavities in the p-type and n-type metal gate stacks, respectively.

8. A method comprising:
   forming p-type and n-type metal gate stacks, each surrounded by silicon nitride (SiN) spacers;
   forming an interlayer dielectric (ILD) surrounding the SiN spacers;
   planarizing the ILD, the p-type and n-type metal gate stacks, and the SiN spacers;
   forming a first cavity in the p-type metal gate stack and forming a second cavity in the n-type metal gate stack;
   forming a nitride liner, with a high density plasma (HDP) process using nitrogen gas ($N_2$), in each of the first and second cavities;
   forming a bulk nitride layer, by HDP using ammonia ($NH_3$), on the nitride liner; and
   planarizing the bulk nitride layer down to the ILD.

9. The method according to claim 8, comprising forming the nitride liner to a thickness of 3 nanometers (nm) to 10 nm.

10. The method according to claim 8, further comprising removing a portion of the SiN spacers surrounding each gate stack prior to removing the portion of the first and second metal gate stacks.

* * * * *